United States Patent
Lee (10) Patent No.: US 7,719,307 B2
(45) Date of Patent: May 18, 2010

(54) DATA OUTPUT DRIVING CIRCUIT OF SEMICONDUCTOR APPARATUS

(75) Inventor: Dong-Uk Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/172,128

(22) Filed: Jul. 11, 2008

(65) Prior Publication Data
US 2009/0167344 A1    Jul. 2, 2009

(30) Foreign Application Priority Data
Dec. 27, 2007    (KR) .................... 10-2007-0138446

(51) Int. Cl.
*H03K 19/003* (2006.01)
(52) U.S. Cl. .................. 326/30; 326/87; 327/170
(58) Field of Classification Search ............. 326/27, 326/30, 87; 327/170, 112
See application file for complete search history.

(56) References Cited

U.S. PATENT DOCUMENTS

| 6,894,529 B1 * | 5/2005 | Chong et al. ............ 326/30 |
|---|---|---|
| 7,019,556 B2 | 3/2006 | Yoo |
| 7,292,953 B2 | 11/2007 | Jung |
| 7,355,453 B2 * | 4/2008 | Watt ........................ 326/87 |
| 2005/0194991 A1 * | 9/2005 | Dour et al. ............... 326/30 |
| 2006/0125516 A1 | 6/2006 | Blodgett et al. |
| 2007/0153591 A1 | 7/2007 | Choi |
| 2008/0278192 A1 | 11/2008 | Lee |

FOREIGN PATENT DOCUMENTS

| JP | 2006-319965 | 11/2006 |
|---|---|---|
| JP | 2007-184080 | 7/2007 |
| KR | 1020000038594 A | 7/2000 |
| KR | 1020070063825 A | 6/2007 |

\* cited by examiner

*Primary Examiner*—Daniel D Chang
(74) *Attorney, Agent, or Firm*—Baker & McKenzie LLP (57) ABSTRACT

A data output driving circuit for a semiconductor apparatus can include a code multiplier configured to multiply a received first code by a multiplication factor determined in response to a control signal and generating a second code; a signal line configured to transmit the second code; and a plurality of data output drivers commonly connected to the signal line and changed in an impedance thereof in response to the second code.

21 Claims, 11 Drawing Sheets

DATA OUTPUT DRIVING CIRCUIT OF SEMICONDUCTOR APPARATUS

CROSS-REFERENCES TO RELATED APPLICATION

The present application claims priority under 35 U.S.C. 119(a) to Korean application number 10-2007-0138446, filed on Dec. 27, 2007, the content of which is incorporated herein in its entirety by reference as if set forth in full.

BACKGROUND

1. Technical Field

The embodiments described herein relate to a semiconductor apparatus, and more particularly, to a data output is driving circuit for a semiconductor apparatus.

2. Related Art

Figure 1:
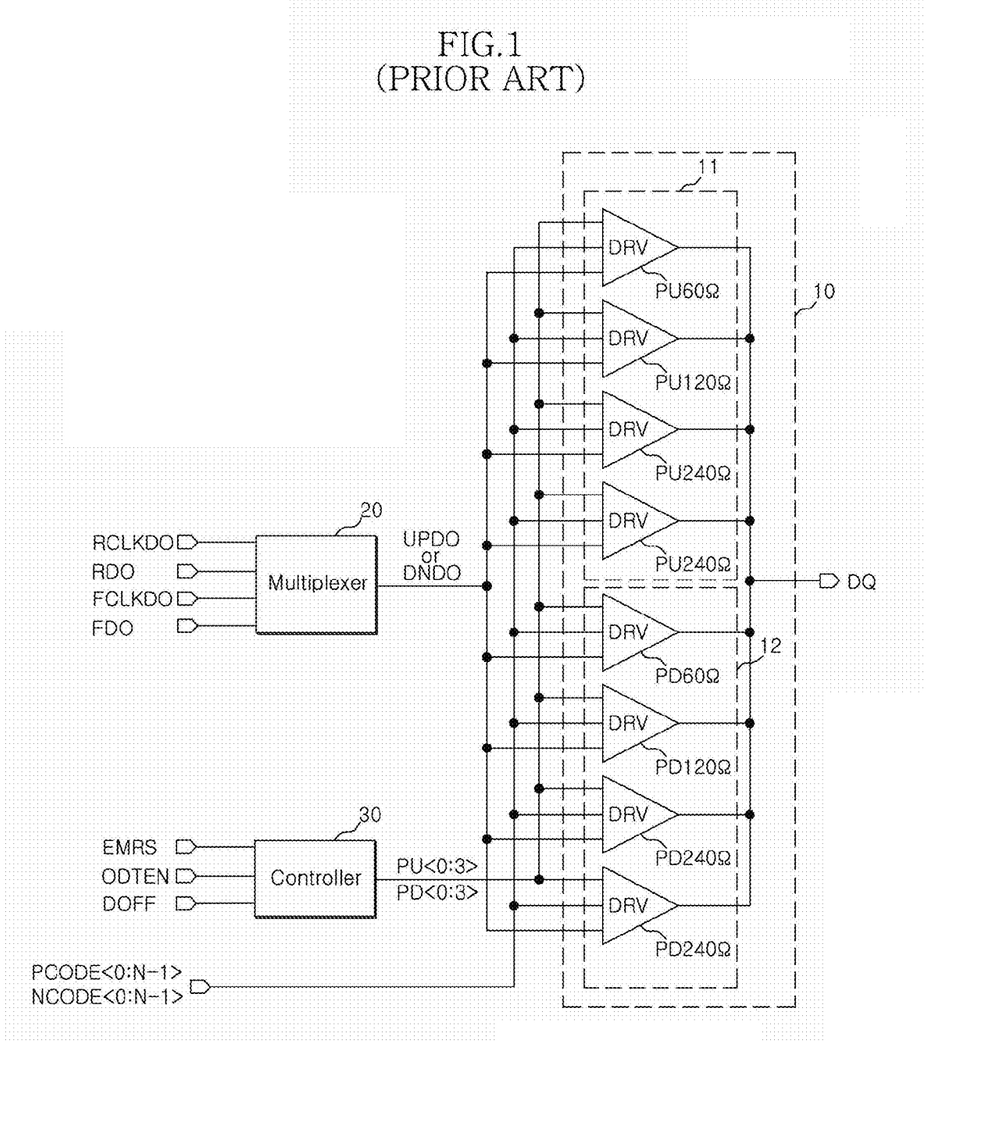
FIG. 1 is a block diagram illustrating a conventional data output driving circuit for a semiconductor apparatus.

FIG. 1 is block diagram illustrating a conventional data output driving circuit for a semiconductor apparatus according to one embodiment. As can be seen, FIG. 1 includes a driver block 10, a multiplexer 20 and a controller 30.

The multiplexer 20 is configured to receive clock signals 'RCLKDO' and 'FCLKDO' and 2 bit parallel data 'RDO' and 'FDO' and to output 1 bit serial data 'UPDO' and 'DNDO'.

The controller 30 is configured to receive a code signal 'EMRS' output from an extended mode register set (EMRS) to determine a driver strength, i.e., an impedance, an on-die termination enable signal 'ODTEN' and a driver off signal 'DOFF' and to output driver select signals 'PU<0:3>' and 'PD<0:3>'.

The driver block 10 includes a pull-up driver block 11 and a pull-down driver block 12.

Figure 2:
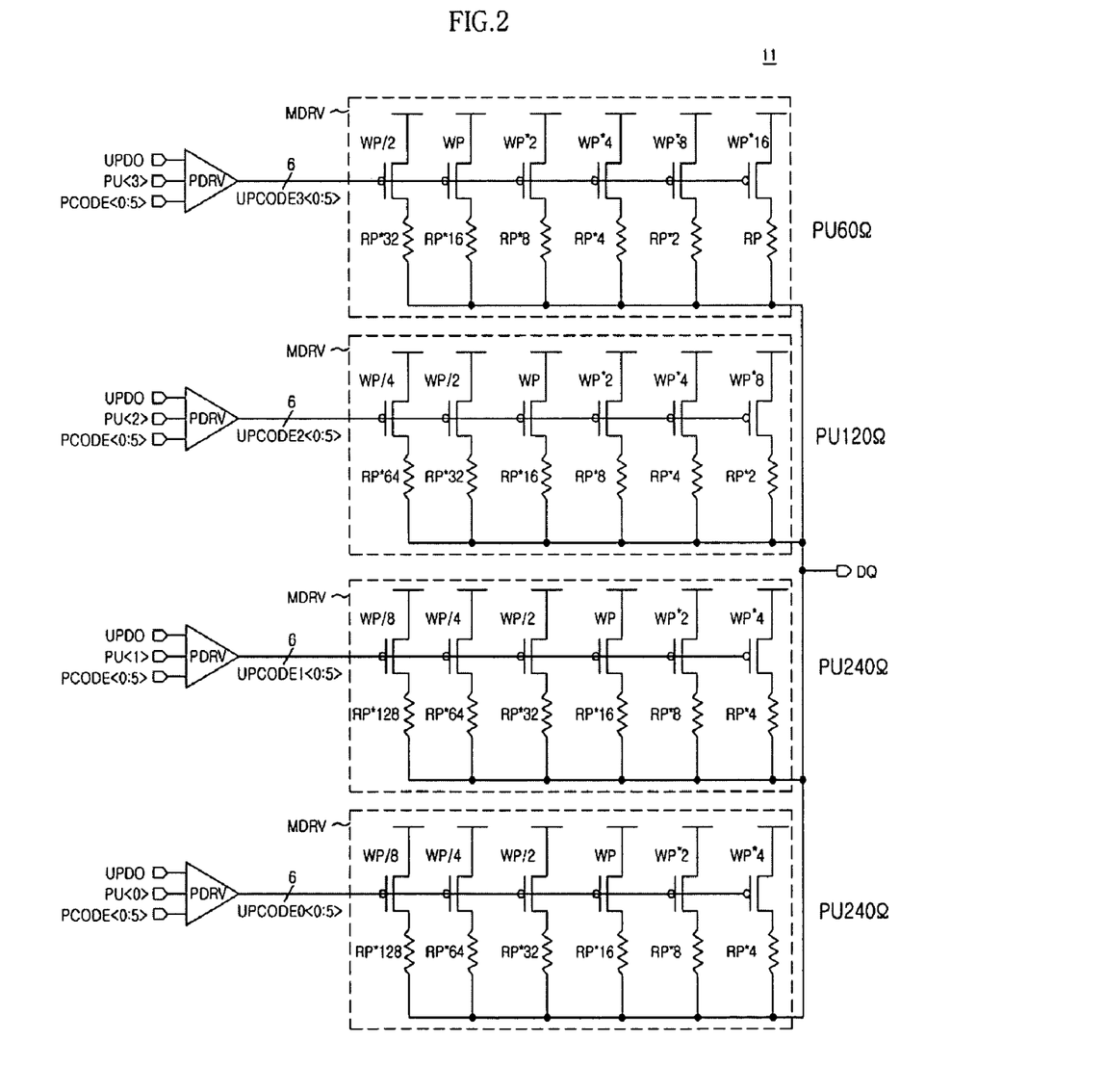
FIG. 2 is a circuit diagram of the pull-up driver block included in the data output driving circuit for a semiconductor apparatus of FIG. 1.

FIG. 2 is a circuit diagram of the pull-up driver block of FIG. 1. As can be seen, the pull-up driver block 11 has four pull-up drivers PU60Ω, PU120Ω, PU240Ω and PU240Ω. Each of the pull-up drivers PU60Ω, PU120Ω, PU240Ω and PU240Ω is composed of a pre-driver PDRV and a main driver MDRV.

The pre-driver PDRV of the pull-up driver PU60Ω receives a one bit serial data 'UPDO', a driver select signal 'PU<3>' and on-die termination codes 'PCODE<0:5>', and outputs control codes 'UPCODE3<0:5>'. The main driver MDRV of the pull-up driver PU60Ω has a plurality of transistors of which the sources are connected with power terminals and the gates receive the control codes 'UPCODE3<0:5>', and a plurality of resistors. One end of each of the resistors is connected with the drains of the plurality of transistors and the other end of each of the resistors is connected with one another.

The basic configurations of the pull-up drivers PU120Ω, PU240Ω and PU240Ω are the same as the pull-up driver PU60Ω. In this regard, if the impedances of the pull-up drivers are different from one another, the pull-up drivers are configured such that the transistors and the resistors constituting the main drivers thereof have different widths and resistances. The resistances of the resistors constituting a main driver MDRV increase in proportion to an impedance, and the widths of the transistors constituting the main driver MDRV decrease in inverse proportion to the impedance.

That is to say, referring to FIG. 2, when compared to the pull-up driver PU60Ω, the pull-up driver PU120Ω is configured such that the resistances of the resistors thereof increase two times and the widths of the transistors thereof decrease to one half. Also, when compared to the pull-up driver PU120Ω, the pull-up driver PU240Ω is configured such that the resistances of the resistors thereof increase two times and the widths of the transistors thereof decrease to one half.

The transistor WP has a basic width, the transistor WP/8 has a width corresponding to ⅛ of the width of the transistor WP, and the transistor WP*16 has a width corresponding to 16 times of the width of the transistor WP. In addition, the resistor RP has a basic resistance and the resistor RP*128 has a resistance corresponding to 128 times of the resistance of the resistor RP.

Figure 3:
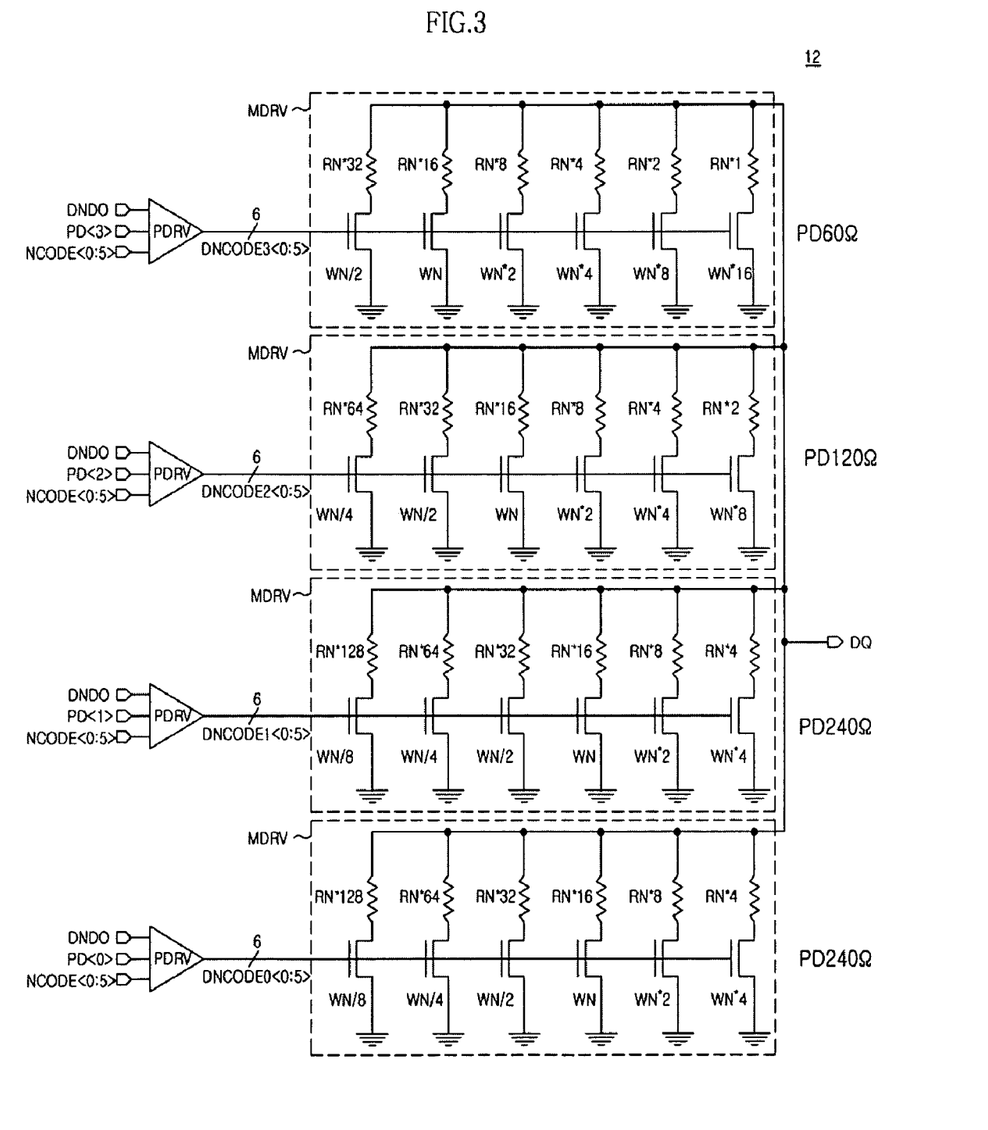
FIG. 3 is a circuit diagram of the pull-down driver block included in the data output driving circuit for a semiconductor apparatus of FIG. 1.

FIG. 3 is a circuit diagram of the pull-down driver block of FIG. 1 and the pull-down driver block 12 has four pull-down drivers PD60Ω, PD120Ω, PD240Ω and PD240Ω. Each of the pull-down drivers PD60Ω, PD120Ω, PD240Ω and PD240Ω is composed of a pre-driver PDRV and a main driver MDRV.

The pre-driver PDRV of the pull-down driver PD60Ω receives a one bit serial data 'DNDO', a driver select signal 'PD<3>' and on-die termination codes 'NCODE<0:5>', and outputs control codes 'DNCODE3<0:5>'. The main driver MDRV of the pull-down driver PD60Ω has a plurality of transistors of which the sources are connected with ground terminals and the gates receive the control codes 'DNCODE3<0:5>' and a plurality of resistors of which one ends are connected with the drains of the plurality of transistors and the other ends are connected with one another.

The basic configurations of the pull-down drivers PD120Ω, PD240Ω and PD240Ω are the same as the pull-down driver PD60Ω. In this regard, if the impedances of the pull-down drivers are different from one another, the pull-down drivers are configured such that the transistors and the resistors constituting the main drivers thereof have different widths and resistances. The principle for configuring these pull-down drivers is the same as that for configuring the pull-up drivers shown in FIG. 2. The transistor WN has a basic width, the transistor WN/8 has a width corresponding to ⅛ of the width of the transistor WN, and the transistor WN*16 has a width corresponding to 16 times of the width of the transistor WN. In addition, the resistor RN has a basic resistance and the resistor RN*128 has a resistance corresponding to 128 times of the resistance of the resistor RN.

The operation of the conventional data output driving circuit of a semiconductor apparatus, configured as described above, will be described below.

The multiplexer 20 converts the 2 bit parallel data 'RDO' and 'FDO' into the 1 bit serial data 'UPDO' and 'DNDO' in response to the clock signals 'RCLKDO' and 'FCLKDO' and outputs the converted data.

The code signal 'EMRS' for determining the strength of the driver block 10 is output from the extended mode register set (EMRS).

The controller 30 determines the operation mode of the driver block 10 based on the on-die termination enable signal 'ODTEN' and the driver off signal 'DOFF', and outputs the driver select signals 'PU<0:3>' and 'PD<0:3>' to conform to the determined operation mode.

When data input operation is implemented in a semiconductor apparatus, the driver off signal 'DOFF' is deactivated, and the on-die termination enable signal 'ODTEN' is activated. According to this, the controller 30 activates only the driver select signals 'PU<0:3>' between the driver select signals 'PU<0:3>' and 'PD<0:3>' such that on-die termination operation can be implemented through the driver block 10, and thereby allows only the pull-up driver block 11 of the driver block 10 to operate.

In the driver block 10, an on-die termination strength, that is, an impedance is determined in response to the on-die termination codes 'PCODE<0:5>' and 'NCODE<0:5>'.

When data output operation is implemented in the semiconductor apparatus, both the driver off signal 'DOFF' and the on-die termination enable signal 'ODTEN' are deactivated. According to this, the controller 30 activates all the driver select signals 'PU<0:3>' and 'PD<0:3>' such that the data output operation can be implemented through the driver block 10, and thereby allows both the pull-up driver block 11 and the pull-down driver block 12 of the driver block 10 to operate.

In the driver block 10, the strengths, that is, the driving impedances of the pull-up driver block 11 and the pull-down driver block 12 are determined in response to the driver select signals 'PU<0:3>' and 'PD<0:3>' output from the controller 30. The driver block 10 drives and outputs the data 'UPDO' and 'DNDO' with the determined impedances.

For example, in order to obtain the strength of 30Ω, all the pull-up drivers PU60Ω, PU120Ω, PU240Ω and PU240Ω are enabled. If all the pull-up drivers PU60Ω, PU120Ω, PU240Ω and PU240Ω are enabled, according to the parallel connection principle of resistors, the strength is calculated as 1/(1/60+1/120+1/240+1/240)=240/8=30Ω.

In addition, in order to obtain the strength of 40Ω, the pull-up drivers PU60Ω and PU120Ω are enabled among the pull-up drivers PU60Ω, PU120Ω, PU240Ω and PU240Ω. If the pull-up drivers PU60Ω and PU120Ω are enabled, according to the parallel connection principle of resistors, the strength is calculated as 1/(1/60+1/120)=120/3=40Ω.

When data input and output operations are not implemented in the semiconductor apparatus, the driver off signal 'DOFF' is activated, and the on-die termination enable signal 'ODTEN' is inactivated. According to this, the controller 30 inactivates all the driver select signals 'PU<0:3>' and 'PD<0:3>' such that both the pull-up driver block 11 and the pull-down driver block 12 of the driver block 10 do not operate.

As can be readily understood from the above description, the conventional data output driving circuit of a semiconductor apparatus has the plurality of drivers so as to obtain various driver strengths and on-die termination strengths. Specifically, in the case of the 120Ω and 240Ω drivers, since they occupy larger areas than the 60Ω driver, the area occupied by the data output driving circuit increases in the entire area of the semiconductor apparatus, whereby a layout margin decreases.

SUMMARY

A data output driving circuit for a semiconductor apparatus, which can decrease a layout area, is described herein.

In one aspect, a data output driving circuit for a semiconductor apparatus comprises a code multiplier configured to multiply an inputted first code by a multiplication factor determined in response to a control signal and generate a second code, a signal line configured to transmit the second code, and a plurality of data output drivers commonly connected to the signal line and changed in an impedance thereof in response to the second code.

In another aspect, a data output driving circuit for a semiconductor apparatus comprises a code multiplier configured to multiply an inputted first code by a multiplication factor determined in response to a control signal and generate a second code, and a data output driver changed in an impedance thereof in response to the second code.

In still another aspect, a data output driving circuit for a semiconductor apparatus comprises a code multiplier configured to change a multiplication factor in response to a control signal and configured to multiply an inputted first code by a changed multiplication factor and generate a second code; and a data output driver comprising a pull-up driver and a pull-down driver, which are commonly connected to data output terminals and implement pull-up driving operation and pull-down driving operation of data with an impedance changed in response to the second code respectively.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to the embodiments described herein, a data output driving circuit for a semiconductor apparatus can decrease a layout area.

Figure 4:
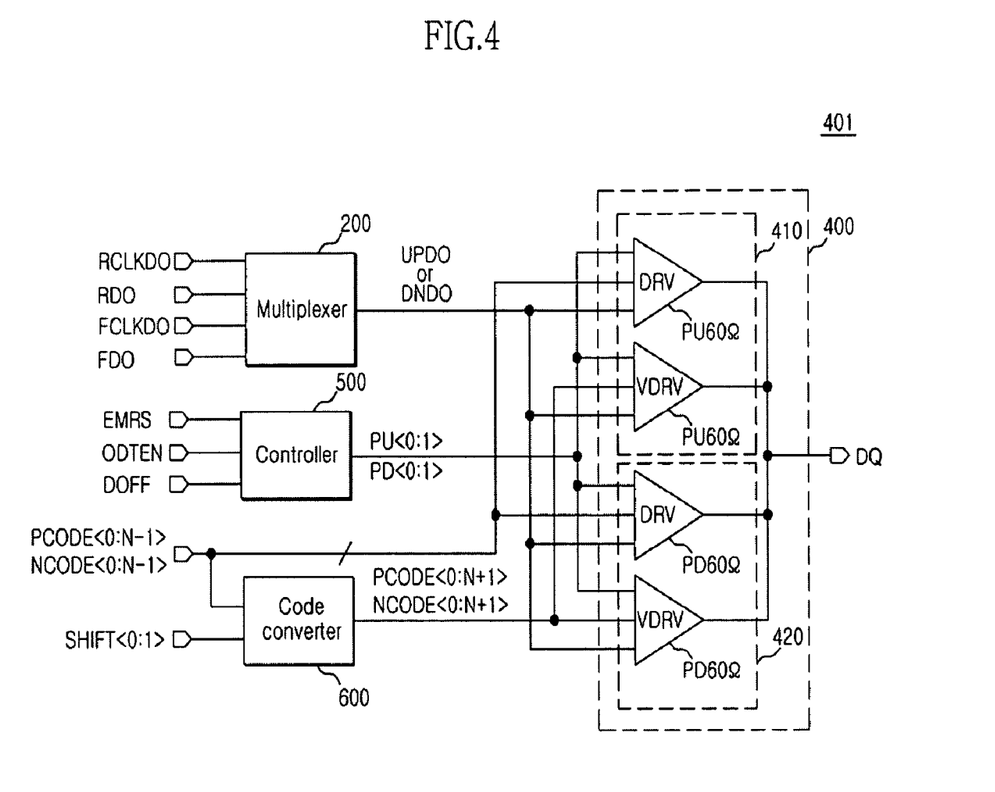
FIG. 4 is a block diagram illustrating a data output driving circuit for a semiconductor apparatus according to one embodiment.

FIG. 4 is a block diagram illustrating a data output driving circuit 401 for a semiconductor apparatus according to an embodiment and the circuit 401 can include a multiplexer 200, a driver block 400, a controller 500 and a code converter 600.

The multiplexer 200 can be configured to receive clock signals 'RCLKDO' and 'FCLKDO' and 2 bit parallel data 'RDO' and 'FDO' and to output 1 bit serial data 'UPDO' and 'DNDO'.

The controller 500 can be configured to receive a code signal 'EMRS' output from an extended mode register set (EMRS) to determine a driver strength, i.e., an impedance, an on-die termination enable signal 'ODTEN' and a driver off signal 'DOFF' and to output driver select signals 'PU<0:1>' and 'PD<0:1>'.

The driver block 400 can be configured such that drivers can be selectively activated in response to the driver selected signals 'PU<0:1>' and 'PD<0:1>' and driver impedances can be changed in response to on-die termination codes 'PCODE<0:N−1>' and 'NCODE<0:N−1>' and shift codes 'PCODE<0:N+1>' and 'NCODE<0:N+1>' output from the code converter 600.

The driver block 400 can include a pull-up driver block 410 and a pull-down driver block 420.

The pull-up driver block 410 can have a pair of drivers, that is, a general driver DRV capable of obtaining an on-die termination impedance in response to the on-die termination codes 'PCODE<0:N−1>' and a variable driver VDRV capable of changing an impedance in response to the shift codes 'PCODE<0:N+1>'.

The general driver DRV of the pull-up driver block 410 can be configured in the same manner as shown in FIG. 2. The variable driver VDRV of the pull-up driver block 410 can have a pre-driver PDRV and a main driver MDRV as shown in FIG. 5.

The pre-driver PDRV can be configured to output codes 'UPCODE<0:7>' obtained by pre-driving shift codes 'PCODE<0:7>' to conform to a data 'UPDO' and a driver select signal 'PU<1>'.

The main driver MDRV can have eight transistors WP/8 through WP*16 that are configured to connect with power terminals, and eight resistors RP*128 through RP that are configured to connect between the eight transistors WP/8 through WP*16 and data output terminals.

Figure 5:
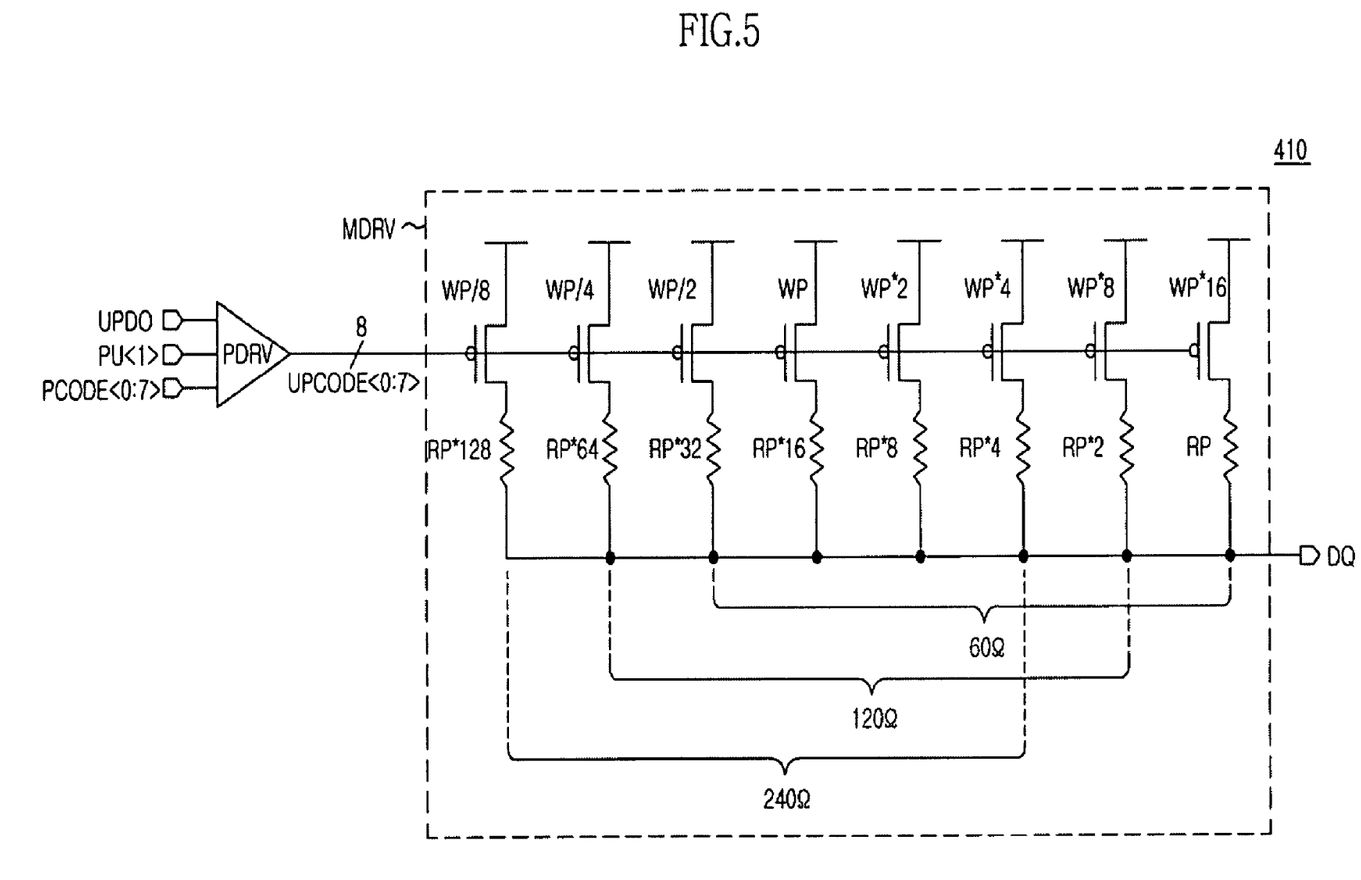
FIG. 5 is a circuit diagram of the pull-up driver block included in the data output driving circuit of FIG. 4.

Among the transistors WP/8 through WP*16 shown in FIG. 5, the transistor WP can have a basic width, the transistor WP/8 can have a width corresponding to ⅛ of the width of the transistor WP, and the transistor WP*16 can have a width corresponding to 16 times of the width of the transistor WP. Also, among the resistors RP through RP*128 shown in FIG. 5, the resistor RP can have a basic resistance, and the resistor RP*128 can have a resistance corresponding to 128 times of the resistance of the resistor RP.

The main driver MDRV according to one embodiment shown in FIG. 5 can be designed such that, when compared to the conventional main driver MDRV, by adding two transistors and two resistors so as to additionally receive 2 bit codes, all the 60Ω, 120Ω and 240Ω drivers as shown in FIG. 2 can be realized. Observing the 60Ω, 120Ω and 240Ω drivers, the 120Ω driver can be realized by shifting by one bit the code inputted to the 60Ω driver, and the 240Ω driver can be realized by shifting by two bits the code inputted to the 60Ω driver.

The pull-down driver block 420 can have a pair of drivers, that is, a general driver DRV capable of obtaining an on-die termination impedance in response to the on-die termination codes 'NCODE<0:N−1>' and a variable driver VDRV capable of changing an impedance in response to the shift codes 'NCODE<0:N+1>'.

The general driver DRV of the pull-down driver block 420 can be configured in the same manner as shown in FIG. 3. The variable driver VDRV of the pull-down driver block 420 can have a pre-driver PDRV and a main driver MDRV as shown in FIG. 6.

The pre-driver PDRV is configured to output codes 'DNCODE<0:7>' obtained by pre-driving shift codes 'NCODE<0:7>' to conform to a data 'DNDO' and a driver select signal 'PD<1>'.

The main driver MDRV has eight transistors WN/8 through WN*16 that are configured to connect with ground terminals, and eight resistors RN*128 through RN which are configured to connect between the eight transistors WN/8 through WN*16 and data output terminals.

Figure 6:
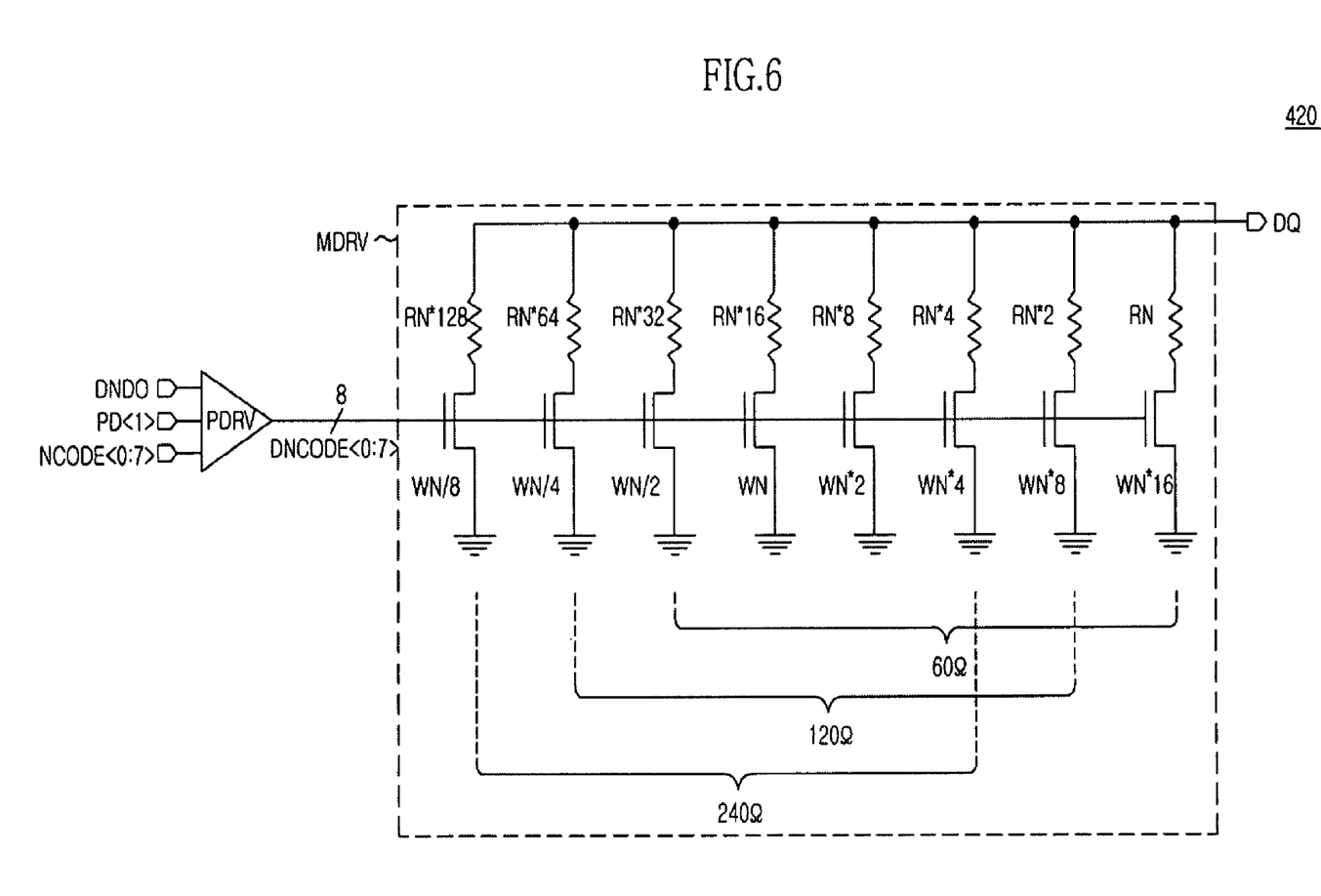
FIG. 6 is a circuit diagram of the pull-down driver block included in the data output driving circuit of FIG. 4.

Among the transistors WN/8 through WN*16 shown in FIG. 6, the transistor WN can have a basic width, the transistor WN/8 can have a width corresponding to ⅛ of the width of the transistor WN, and the transistor WN*16 can have a width corresponding to 16 times of the width of the transistor WN. Also, among the resistors RN through RN*128 shown in FIG. 6, the resistor RN can have a basic resistance, and the resistor RN*128 can have a resistance corresponding to 128 times of the resistance of the resistor RN. The main driver MDRV according to one embodiment shown in FIG. 6 can be designed such that, when compared to the conventional main driver MDRV, by adding two transistors and two resistors so as to additionally receive 2 bit codes, all the 60Ω, 120Ω and 240Ω drivers as shown in FIG. 3 can be realized. Observing the 60Ω, 120Ω and 240Ω drivers, the 120Ω driver can be realized by shifting by one bit the code inputted to the 60Ω driver, and the 240Ω driver can be realized by shifting by two bits the code inputted to the 60Ω driver.

The code converter 600 can be configured using a barrel shifter, which is widely used as a device for moving a code or data, by a desired number of bits leftward or rightward. Because the two kinds of on-die termination codes 'PCODE<0:N−1>' and 'NCODE<0:N−1>' can be input to the code converter 600, the code converter 600 can be configured using two barrel shifters.

Figure 7:
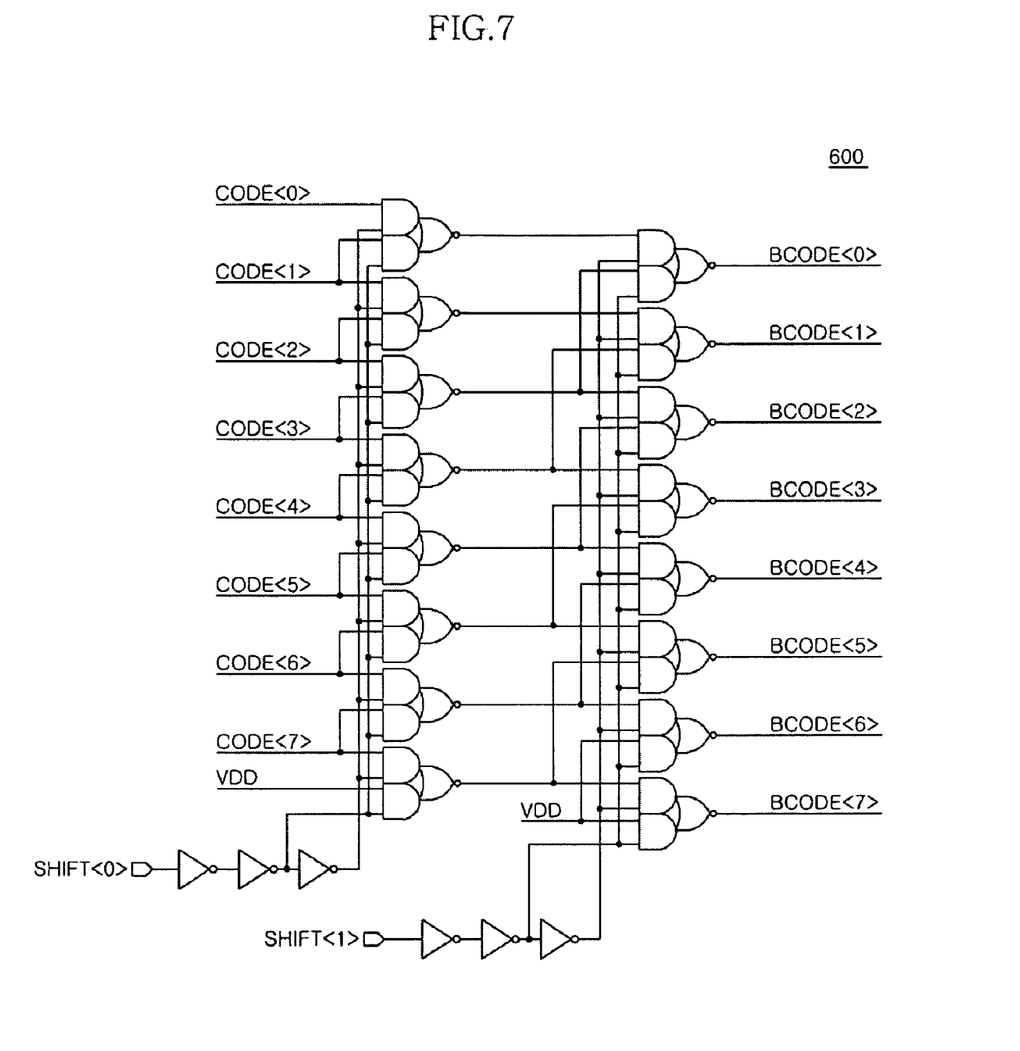
FIG. 7 is a circuit diagram of the code converter included in the data output driving circuit of FIG. 4.

The configuration of the barrel shifter is as shown in FIG. 7. The operation of the barrel shifter will be described below with reference to FIG. 8. A received code signal can be shifted in response to the control signals 'SHIFT<0:1>', and can then be output. As a result, when the control signals 'SHIFT<0:1>' are '00', codes 'CODE<0:7>(11010100)' are output as they are, i.e., as codes 'BCODE<0:7>(11010100)'.

Figure 8:
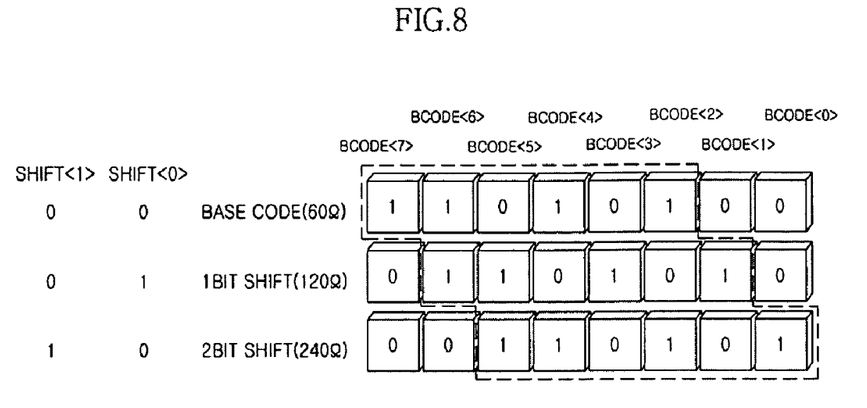
FIG. 8 is a conceptual view illustrating the operation of the code converter shown in FIG. 7 according to one embodiment.

When the control signals 'SHIFT<0:1>' are '01', the codes 'CODE<0:7>(11010100)' can be shifted by one bit and can be output as the codes 'BCODE<0:7>(01101010)', and when the control signals 'SHIFT<0:1>' are '10', the codes 'CODE<0:7>(11010100)' can be shifted by two bits and can be output as the codes 'BCODE<0:7>(00110101)'. The control signals 'SHIFT<0:1>' can use register values of the EMRS (extended mode register set). The codes 'CODE<0:7>' can correspond to the on-die termination codes 'PCODE<0:N−1>' and 'NCODE<0:N−1>', and the codes 'BCODE<0:7>' can correspond to the shift codes 'PCODE<0:N+1>' and 'NCODE<0:N+1>'.

The operation of the data output driving circuit for a semiconductor apparatus according to one embodiment, configured as mentioned above, will now be described below.

The multiplexer 200 can convert the 2 bit parallel data 'RDO' and 'FDO' into the 1 bit serial data 'UPDO' and 'DNDO' in response to the clock signals 'RCLKDO' and 'FCLKDO' and can output the converted data.

The code signal 'EMRS' for determining the strength of the driver block 400 can be output from the extended mode register set (EMRS).

The controller 500 can determine the operation mode of the driver block 400 based on the on-die termination enable signal 'ODTEN' and the driver off signal 'DOFF', and can output the driver selected signals 'PU<0:1>' and 'PD<0:1>' to conform to the determined operation mode.

When both data input and output operations cannot be implemented in a semiconductor apparatus, the driver off signal 'DOFF' can be activated, and the on-die termination enable signal 'ODTEN' can be deactivated. As a result, the controller 500 can deactivate all the driver select signals 'PU<0:1>' and 'PD<0:1>' such that both the pull-up driver block 410 and the pull-down driver block 420 of the driver block 400 cannot operate.

When data input operation can be implemented in the semiconductor apparatus, the driver off signal 'DOFF' can be deactivated, and the on-die termination enable signal 'ODTEN' can be activated. As a result, the controller 500 can activate only the driver selected signals 'PU<0:1>' between the driver select signals 'PU<0:1>' and 'PD<0:1>' such that on-die termination operation can be implemented through the driver block 400, and thereby can allow only the pull-up driver block 410 of the driver block 400 to operate.

When a data output operation is implemented in the semiconductor apparatus, both the driver off signal 'DOFF' and the on-die termination enable signal 'ODTEN' can be deactivated. As a result, the controller 500 can activate all the driver select signals 'PU<0:1>' and 'PD<0:1>' such that the data output operation can be implemented through the driver block 400, and thereby can allow both the pull-up driver block 410 and the pull-down driver block 420 of the driver block 400 to operate.

The general drivers DRVs of the driver block 400 can be set to an impedance of 60Ω in response to the on-die termination codes 'PCODE<0:5>' and 'NCODE<0:5>', and the variable drivers VDRVs can be determined to have one impedance among 60Ω, 120Ω and 240Ω in response to the shift codes 'PCODE<0:7>' and 'NCODE<0:7>'. Also, drivers to be activated can be selected between the general drivers DRVs and the variable drivers VDRVs in response to the driver select signals 'PU<0:1>' and 'PD<0:1>' output from the controller 500, such that final driving strengths can be determined through the impedance combination of the general drivers DRVs and the variable drivers VDRVs. The driver block 400 can drive and output the data 'UPDO' and 'DNDO' with the finally determined driving strengths.

For example, in order to obtain the strength of 30Ω, all the general drivers DRVs and the variable drivers VDRVs of the driver block 400 can be activated, and the impedance of the variable drivers VDRVs can be set to 60Ω. As shown in FIG. 8, if the control signals 'SHIFT<0:1>' input to the code converter 600 are '00', the shift codes 'PCODE<0:7>' and 'NCODE<0:7>' outputted from the code converter 600 can set the variable drivers VDRVs to 60Ω. Therefore, if the impedances of both the general drivers DRV and the variable drivers VDRV are set to 60Ω, the strength is calculated as $1/(1/60+1/60)=60/2=30\Omega$, according to the parallel connection principle of resistors.

For example, in order to obtain the strength of 40Ω, all the general drivers DRVs and the variable drivers VDRVs of the driver block 400 can be activated, and the impedance of the variable drivers VDRVs can be set to 120Ω. As shown in FIG. 8, if the control signals 'SHIFT<0:1>' input to the code converter 600 are '01', the shift codes 'PCODE<0:7>' and 'NCODE<0:7>' output from the code converter 600 can set the variable drivers VDRVs to 120Ω. Therefore, if the impedance of the general drivers DRV is set to 60Ω and the impedance of the variable drivers VDRV is set to 120Ω, the strength is calculated as $1/(1/60+1/120)=120/3=40\Omega$, according to the parallel connection principle of resistors.

Furthermore, in order to obtain the strength of 48Ω, all the general drivers DRVs and the variable drivers VDRVs of the driver block 400 can be activated, and the impedance of the variable drivers VDRVs can be set to 240Ω. As shown in FIG. 8, if the control signals 'SHIFT<0:1>' input to the code converter 600 are '10', the shift codes 'PCODE<0:7>' and 'NCODE<0:7>' output from the code converter 600 can set the variable drivers VDRVs to 240Ω. Therefore, if the impedance of the general drivers DRV is set to 60Ω and the impedance of the variable drivers VDRV is set to 240Ω, the strength is calculated as $1/(1/60+1/240)=240/5=48\Omega$, according to the parallel connection principle of resistors.

Figure 9:
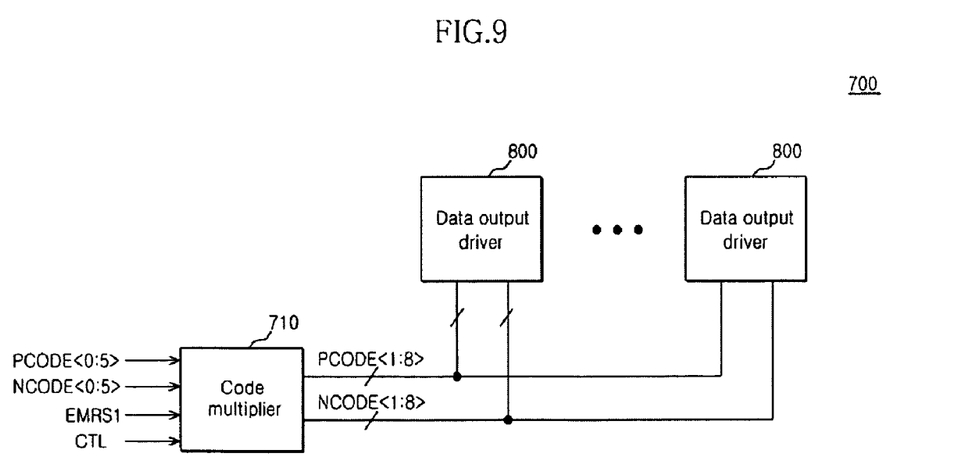
FIG. 9 is a block diagram illustrating a data output driving circuit for a semiconductor apparatus according to one embodiment.

FIG. 9 is a block diagram illustrating a data output driving circuit for a semiconductor apparatus in accordance with one embodiment. The data output driving circuit 700 for a semiconductor apparatus can include a code multiplier 710 and a plurality of data output drivers 800.

The code multiplier 710 can be configured to multiply respective on-die termination codes 'PCODE<0:5>' and 'NCODE<0:5>' by a multiplication factor that can be determined in response to the combination of a signal 'EMRS1' output from an extended mode register set (EMRS) and a control signal 'CTL' and to output multiplication codes 'PCODE<1:8>' and 'NCODE<1:8>'. Although the multiplication codes 'PCODE<1:8>' and 'NCODE<1:8>' are originally composed of 9 bits, the lowermost bits 'PCODE<0>' and 'NCODE<0>' that do not exert any influence on the impedances of drivers can be omitted. By omitting the lowermost bits, the sizes of signal lines and the drivers can be further decreased.

The code multiplier 710 can be configured to use a conventionally used multiplier. Because the two kinds of on-die termination codes 'PCODE<0:5>' and 'NCODE<0:5>' are used, two multipliers are needed.

The plurality of data output drivers 800 are configured to drive data 'UPDO' or 'DNDO' with a driver impedance that can be changed in response to the multiplication codes 'PCODE<1:8>' and 'NCODE<1:8>'.

Figure 10:
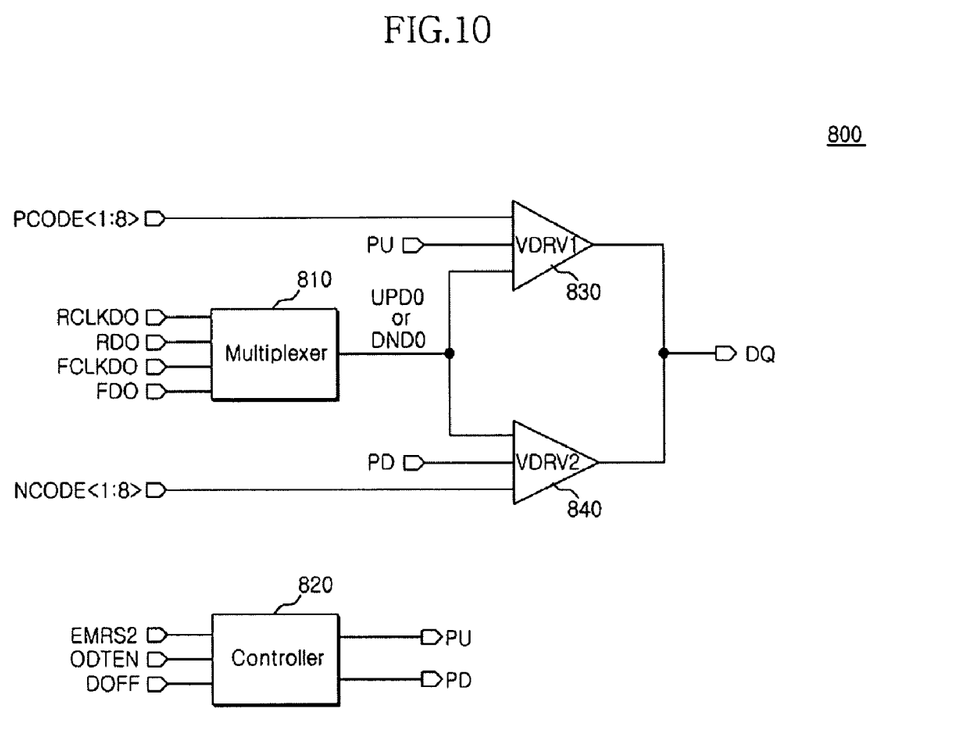
FIG. 10 is a block diagram of the data output driver included in the circuit shown in FIG. 9 according to one embodiment.

FIG. 10 is a block diagram of the data output driver shown in FIG. 9 according to one embodiment. Each of the plurality of data output drivers 800 can include a multiplexer 810, a controller 820, and a driver block composed of a pull-up driver VDRV1 830 and a pull-down driver VDRV2 840.

The multiplexer 810 can be configured to receive clock signals 'RCLKDO' and 'FCLKDO' and 2 bit parallel data 'RDO' and 'FDO' and to output 1 bit serial data 'UPDO' and 'DNDO'.

The controller 820 can be configured to receive a signal 'EMRS2' output from an extended mode register set (EMRS) to determine a driver strength, i.e., an impedance, an on-die termination enable signal 'ODTEN' and a driver off signal 'DOFF' and to output driver select signals 'PU' and 'PD'.

The pull-up driver 830 and the pull-down driver 840 can comprise impedance-variable drivers, which can be activated in response to the driver select signals 'PU' and 'PD' and can be changed in impedances thereof in response to the multiplication codes 'PCODE<1:8>' and 'NCODE<1:8>'.

Figure 11:
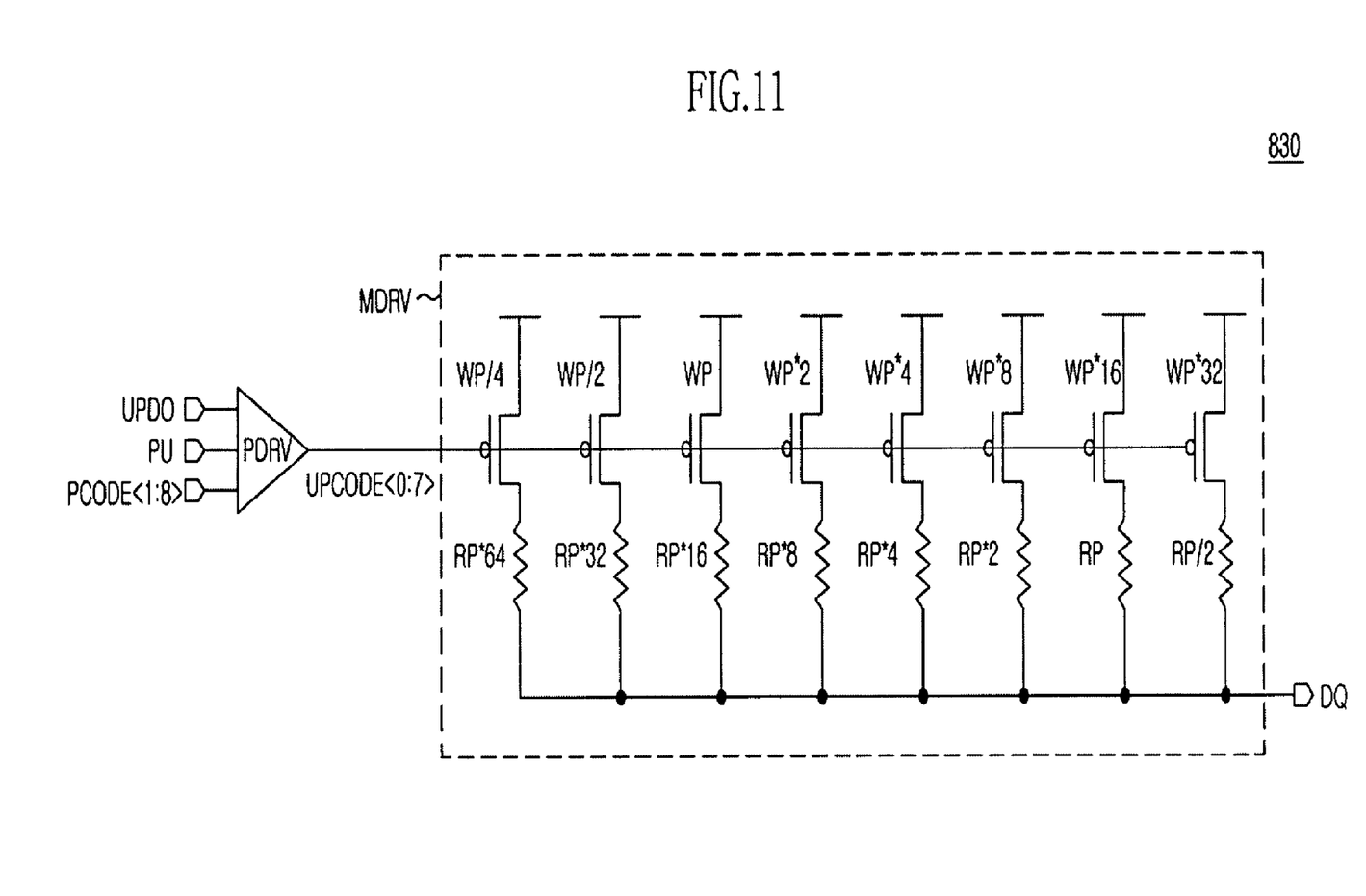
FIG. 11 is a circuit diagram of the pull-up driver block included in the driver shown in FIG. 10 according to one embodiment.

The pull-up driver 830 can comprise a pre-driver PDRV and a main driver MDRV as shown in FIG. 11.

The pre-driver PDRV can be configured to output codes 'UPCODE<1:8>' obtained by pre-driving multiplication codes 'PCODE<1:8>' to conform to a data 'UPDO' and a driver select signal 'PU'.

The main driver MDRV can have eight transistors WP/4 through WP*32 which can be connected with power terminals, and eight resistors RP*64 through RP/2, which can be connected between the eight transistors WP/4 through WP*32 and data output terminals. Among the transistors WP/4 through WP*32 shown in FIG. 11, the transistor WP can have a basic width, the transistor WP/4 can have a width corresponding to ¼ of the width of the transistor WP, and the transistor WP*32 can have a width corresponding to 32 times of the width of the transistor WP. Also, among the resistors RP*64 through RP/2 shown in FIG. 11, the resistor RP can have a basic resistance, and the resistor RP*64 can have a resistance corresponding to 64 times of the resistance of the resistor RP. The main driver MDRV according to one embodiment shown in FIG. 11 is designed such that all the impedances of 240Ω, 120Ω, 80Ω, 60Ω, 48Ω, 40Ω, 33Ω and 30Ω can be realized in response to the multiplication codes 'PCODE<1:8>'.

Figure 12:
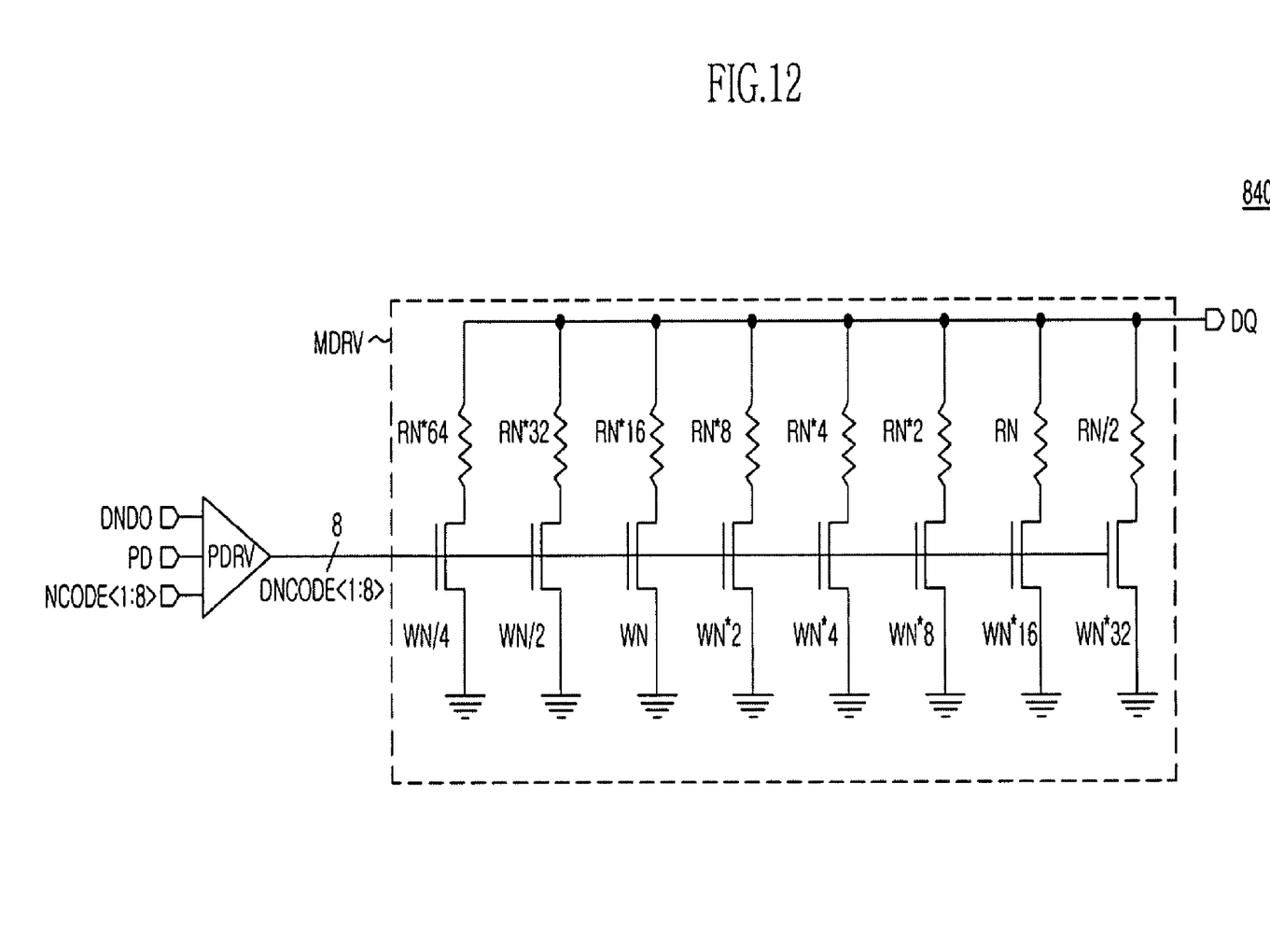
FIG. 12 is a circuit diagram of the pull-down driver block included in the driver shown in FIG. 10 according to one embodiment.

The pull-down driver 840 can comprise a pre-driver PDRV and a main driver MDRV as shown in FIG. 12.

The pre-driver PDRV can be configured to output codes 'DNCODE<1:8>' obtained by pre-driving multiplication codes 'NCODE<1:8>' to conform to a data 'DNDO' and a driver select signal 'PD'.

The main driver MDRV can have eight transistors WN/4 through WN*32 which can be connected with ground terminals, and eight resistors RN*64 through RN/2, which can be connected between the eight transistors WN/4 through WN*32 and data output terminals. Among the transistors WN/4 through WN*32 shown in FIG. 12, the transistor WN can have a basic width, the transistor WN/4 can have a width corresponding to ¼ of the width of the transistor WN, and the transistor WN*32 can have a width corresponding to 32 times of the width of the transistor WN. Also, among the resistors RN*64 through RN/2 shown in FIG. 12, the resistor RN can have a basic resistance, and the resistor RN*64 can have a resistance corresponding to 64 times of the resistance of the resistor RN. The main driver MDRV according to one embodiment shown in FIG. 12 is designed such that all the impedances of 240Ω, 120Ω, 80Ω, 60Ω, 48Ω, 40Ω, 33Ω and 30Ω can be realized in response to the multiplication codes 'NCODE<1:8>'.

The operation of the data output driving circuit of a semiconductor apparatus in accordance with another embodiment, configured as mentioned above, will be described below.

The signals 'EMRS1' and 'EMRS2' for determining whether the pull-up driver 830 or the pull-down driver 840 can be operated and for determining the multiplication factor of the code multiplier 710 cam be outputted from the extended mode register set (EMRS).

The code multiplier 710 can multiply the respective on-die termination codes 'PCODE<0:5>' and 'NCODE<0:5>' by a multiplication factor that can be determined in response to the combination of the signal 'EMRS1' and the control signal 'CTL', and can output the multiplication codes 'PCODE<1:8>' and 'NCODE<1:8>'

The principle in which the impedance of the pull-up driver 830 and the pull-down driver 840 can be determined to any one of 240Ω, 120Ω, 80Ω, 60Ω, 48Ω, 40Ω, 33Ω and 30Ω in response to the multiplication codes 'PCODE<1:8>' and 'NCODE<1:8>' will be explained below with reference to Table 1.

Table 1 gives examples of multiplication code values and impedance values conforming to a change in the multiplication factor of the code multiplier 710 according to one embodiment. The rightmost codes expressed in heavy numbers represent values corresponding to the lowermost bits 'PCODE<0>' and 'NCODE<0>' and are not used in the application example of one embodiment.

TABLE 1

| Multiplication Factor | Multiplication Code | Impedance |
|---|---|---|
| 1 | 000110101 | 240 Ω |
| 2 | 001101010 | 120 Ω |
| 3 | 010011111 | 80 Ω |
| 4 | 011010100 | 60 Ω |
| 5 | 100001001 | 48 Ω |
| 6 | 100111110 | 40 Ω |
| 7 | 101110011 | 33 Ω |
| 8 | 110101000 | 30 Ω |

The transistors and resistors of the pull-up driver 830 and the pull-down driver 840 shown in FIGS. 11 and 12 have arrangements of binary weights. Accordingly, the parallel connection of two codes can be replaced with one code for each of the multiplication codes 'PCODE<1:8>' and 'NCODE<1:8>'.

When assuming that the code value '000110101' corresponding to 240Ω is a reference code value, 120Ω can be realized by parallel connecting 240Ω and 240Ω, and the code value '001101010' corresponding to 120Ω is a value obtained by adding the reference code value '000110101' to the reference code value '000110101'. The code value '001101010' corresponding to 120Ω is the same as the value obtained by shifting the reference code value '000110101' by 1 bit.

In addition, 60Ω can be realized by parallel connecting 240Ω and 80Ω. Because 80Ω can be realized by parallel connecting 240Ω and 12Ω, the code value '011010100' corresponding to 60Ω is a value obtained by adding the reference code value '000110101', the reference code value '000110101', and the code value '001101010' corresponding to 120Ω. The code value '011010100' corresponding to 60Ω is the same as the value obtained by shifting the reference code value '000110101' by 2 bits.

Referring to Table 1, it is to be appreciated that the reference code value '000110101', the value obtained by shifting the reference code value '000110101' by 1 bit, and the value obtained by shifting the reference code value '000110101' by 2 bits correspond to the values that are obtained by multiplying the reference code value '000110101' by the respective multiplication factors 1, 2 and 4 in the code multiplier 710.

In this way, 80Ω can be realized by parallel connecting 240Ω and 120Ω. The multiplication factor that is to be multiplied to the reference code value '000110101' in order to realize the code value '010011111' corresponding to 80Ω is '3' that can be obtained by adding the multiplication factor '1' corresponding to 240Ω and the multiplication factor '2' corresponding to 120Ω.

48Ω can be realized by parallel connecting 240Ω and 60Ω. The multiplication factor that is to be multiplied to the reference code value '000110101' in order to realize the code value '100001001' corresponding to 48Ω is '5' that is obtained by adding the multiplication factor '1' corresponding to 240Ω and the multiplication factor '4' corresponding to 60Ω.

40Ω can be realized by parallel connecting 240Ω and 48Ω. The multiplication factor that is to be multiplied to the reference code value '000110101' in order to realize the code value '100111110' corresponding to 40Ω is '6' that is obtained by adding the multiplication factor '1' corresponding to 240Ω and the multiplication factor '5' corresponding to 48Ω.

33Ω can be realized by parallel connecting 240Ω and 40Ω. The multiplication factor that is to be multiplied to the reference code value '000110101' in order to realize the code value '101110011' corresponding to 33Ω is '7' that is obtained by adding the multiplication factor '1' corresponding to 240Ω and the multiplication factor '6' corresponding to 40Ω.

30Ω can be realized by parallel connecting 240Ω and 33Ω. The multiplication factor that is to be multiplied to the reference code value '000110101' in order to realize the code value '110101000' corresponding to 30Ω is '8' that is obtained by adding the multiplication factor '1' corresponding to 240Ω and the multiplication factor '7' corresponding to 33Ω.

The multiplexer 810 of the data output driver 800 can convert the 2 bit parallel data 'RDO' and 'FDO' into the 1 bit serial data 'UPDO' and 'DNDO' in response to the clock signals 'RCLKDO' and 'FCLKDO' and can output the converted data.

The controller 820 can output the driver selected signals 'PU' and 'PD' in response to the signal 'EMRS2', the on-die termination enable signal 'ODTEN' and the driver off signal 'DOFF'.

When both data input and output operations cannot be implemented in a semiconductor apparatus, the driver off signal 'DOFF' can be activated, and the on-die termination enable signal 'ODTEN' can be inactivated. As a result, the controller 820 can inactivate all the driver selected signals 'PU' and 'PD' such that both the pull-up driver 830 and the pull-down driver 840 cannot operate.

When data input operation can be implemented in the semiconductor apparatus, the driver off signal 'DOFF' can be inactivated, and the on-die termination enable signal 'ODTEN' can be activated. As a result, the controller 820 can activate only the driver select signals 'PU' between the driver select signals 'PU' and 'PD' such that on-die termination operation can be implemented, and thereby can allow only the pull-up driver 830 to operate.

When data output operation can be implemented in the semiconductor apparatus, both the driver off signal 'DOFF' and the on-die termination enable signal 'ODTEN' can be inactivated. As a result, the controller 820 can activates all the driver select signals 'PU' and 'PD', and thereby can allow both the pull-up driver 830 and the pull-down driver 840 to operate.

The pull-up drivers 830 and the pull-down drivers 840 of all the data output drivers 800 can drive and output data 'UPDO' and 'DNDO' with any one impedance determined among 240Ω, 120Ω, 80Ω, 60Ω, 48Ω, 40Ω, 33Ω and 30Ω in response to the multiplication codes 'PCODE<1:8>' and 'NCODE<1:8>'.

The data output driving circuit for a semiconductor apparatus according to one embodiment has effects as described below.

First, because all impedance values that are necessary for data output can be realized using one driver for each of data pull-up and data pull-down and the impedances of all data output drivers can be adjusted in the same manner using one code multiplier, the layout area of the semiconductor apparatus can be significantly decreased.

Second, because the number of drivers decreases, the parasitic capacitance that can be induced from overlapping resistor components and transistor components due to the provision of a plurality of drivers can be reduced, whereby, as noise decreases, the reliability of output data can be improved.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A data output driving circuit of a semiconductor apparatus, comprising:
    a code multiplier configured to generate a second code by multiplying a received first code by a multiplication factor in response to a control signal, wherein the second code is shifted according to a shift of the multiplication factor;
    a signal line configured to transmit the second code; and
    a plurality of data output drivers receiving the second code by the signal line, configured to be shifted in an impedance thereof in response to the shift of the second code.

2. The data output driving circuit according to claim 1, wherein the code multiplier is configured to be determined in the multiplication factor according to a first value stored in a mode register.

3. The data output driving circuit according to claim 1, wherein the code multiplier is configured to generate the second code by multiplying a preset reference code by the multiplication factor.

4. The data output driving circuit according to claim 1, wherein the plurality of data output drivers includes at least one driver which is changed in the impedance thereof in response to the second code.

5. The data output driving circuit according to claim 4, wherein the plurality of data output drivers further include a controller for determining whether at least one driver is to be operated or not.

6. The data output driving circuit according to claim 5, wherein the controller is configured to determine whether the at least one driver is to be operated or not, according to a second value stored in the mode register.

7. The data output driving circuit according to claim 1, wherein the first code is an on-die termination code.

8. The data output driving circuit according to claim 5, wherein the at least one driver comprises:
    a pre-driver configured to pre-drive and then output the second code in response to an output signal of the controller; and
    a main driver having a plurality of transistors connected with power voltage terminals and a plurality of resistors connected between the plurality of transistors and data output terminals, and changed in an impedance thereof in response to a code output from the pre-driver.

9. The data output driving circuit according to claim 8, wherein the plurality of transistors are located such that their widths are sequentially doubled or halved in a direction.

10. The data output driving circuit according to claim 8, wherein the plurality of resistors are located such that their resistances are sequentially halved or doubled in a direction.

11. A data output driving circuit of a semiconductor apparatus, comprising:
    a code multiplier configured to generate a second code by multiplying a received first code by a predetermined multiplication factor in response to a control signal, wherein the second code is shifted according to a shift of the multiplication factor; and
    a data output driver configured to be shifted in a driving strength thereof in response to the shift of the second code.

12. The data output driving circuit according to claim 11, wherein the code multiplier is configured to be determined in the multiplication factor according to a first value stored in a mode register.

13. The data output driving circuit according to claim 11, wherein the code multiplier is configured to generate the second code by multiplying a preset reference code by the multiplication factor.

14. The data output driving circuit according to claim 11, wherein the first code is an on-die termination code.

15. The data output driving circuit according to claim 11, wherein the data output driver comprises:
 a pre-driver configured to pre-drive and then output the second code; and
 a main driver having a plurality of transistors connected with power voltage terminals and a plurality of resistors connected between the plurality of transistors and data output terminals, and changed in a driving strength thereof in response to a code output from the pre-driver,
 wherein the plurality of transistors are located such that their widths are sequentially doubled or halved in a direction and the plurality of resistors are located such that their resistances are sequentially halved or doubled in a direction.

16. A data output driving circuit of a semiconductor apparatus, comprising:
 a code multiplier configured to generate a second code by changing a multiplication factor in response to a control signal and multiplying a received first code by a changed multiplication factor, wherein the second code is shifted according to the changing of the multiplication factor; and
 a data output driver comprising a pull-up driver and a pull-down driver which are commonly connected to data output terminals and respectively implement pull-up driving operation and pull-down driving operation of data with a driving strength changed in response to the second code.

17. The data output driving circuit according to claim 16, wherein the code multiplier is configured to be changed in the multiplication factor according to a first value stored in a mode register.

18. The data output driving circuit according to claim 16, wherein the code multiplier is configured to generate the second code by multiplying a reference code corresponding to a maximum driving strength value by the multiplication factor.

19. The data output driving circuit according to claim 16, wherein the data output driver further comprises a controller for selectively operating the pull-up driver and the pull-down driver.

20. The data output driving circuit according to claim 19, wherein the pull-up driver comprises:
 a pre-driver configured to pre-drive and then output the second code in response to an output signal of the controller; and
 a main driver having a plurality of transistors connected with power terminals and a plurality of resistors connected between the plurality of transistors and data output terminals, and changed in a driving strength thereof in response to a code output from the pre-driver,
 wherein the plurality of transistors are located such that their widths are sequentially doubled or halved in a direction and the plurality of resistors are located such that their resistances are sequentially halved or doubled in a direction.

21. The data output driving circuit according to claim 19, wherein the pull-down driver comprises:
 a pre-driver configured to pre-drive and then output the second code in response to an output signal of the controller; and
 a main driver having a plurality of transistors connected with ground terminals and a plurality of resistors connected between the plurality of transistors and data output terminals, and changed in a driving strength thereof in response to a code output from the pre-driver,
 wherein the plurality of transistors are located such that their widths are sequentially doubled or halved in a direction and the plurality of resistors are located such that their resistances are sequentially halved or doubled in a direction.

* * * * *